US007672098B2

(12) United States Patent
Zhang et al.

(10) Patent No.: US 7,672,098 B2
(45) Date of Patent: Mar. 2, 2010

(54) POWER PLUG WITH LEAKAGE CURRENT DETECTION AND PROTECTION CIRCUIT

(75) Inventors: Long Zhang, Shanghai (CN); Chengli Li, Shanghai (CN)

(73) Assignee: Shanghai ELE Manufacturing Corp., Shanghai (CN)

( * ) Notice: Subject to any disclaimer, the term of this patent is extended or adjusted under 35 U.S.C. 154(b) by 218 days.

(21) Appl. No.: 11/739,665

(22) Filed: Apr. 24, 2007

(65) Prior Publication Data

US 2008/0094764 A1 Apr. 24, 2008

(30) Foreign Application Priority Data

Oct. 23, 2006 (CN) .................... 2006 2 0134149 U

(51) Int. Cl.
*H02H 9/08* (2006.01)
*H01L 23/28* (2006.01)

(52) U.S. Cl. .......................... 361/42; 174/521; 174/524

(58) Field of Classification Search .................. 361/45, 361/42; 174/521, 524
See application file for complete search history.

(56) References Cited

U.S. PATENT DOCUMENTS

| | | | | |
|---|---|---|---|---|
| 4,709,293 | A | 11/1987 | Gershen et al. | |
| 4,839,483 | A * | 6/1989 | Doyle | 200/302.1 |
| 4,909,750 | A * | 3/1990 | Neumann | 439/271 |
| 4,931,894 | A | 6/1990 | Legatti | |
| 5,508,894 | A * | 4/1996 | Payne et al. | 362/485 |
| 5,862,029 | A * | 1/1999 | Nicol | 361/42 |
| 6,122,155 | A * | 9/2000 | Aromin et al. | 361/42 |
| 6,292,337 | B1 | 9/2001 | Legatti et al. | |
| 6,738,241 | B1 | 5/2004 | Aromin | |
| 7,136,266 | B2 | 11/2006 | Gershen et al. | |
| 7,170,375 | B2 * | 1/2007 | Chen et al. | 335/177 |
| 2004/0070895 | A1 | 4/2004 | Gershen et al. | |
| 2005/0243485 | A1 | 11/2005 | Gershen et al. | |
| 2005/0280961 | A1 | 12/2005 | Campolo | |
| 2006/0007610 | A1 | 1/2006 | Chan et al. | |
| 2006/0061924 | A1 | 3/2006 | Zhang | |
| 2006/0146456 | A1 | 7/2006 | Williams | |
| 2006/0198067 | A1 | 9/2006 | Pearse | |
| 2006/0203402 | A1 | 9/2006 | Aromin | |
| 2007/0025032 | A1 | 2/2007 | Bradley et al. | |

* cited by examiner

*Primary Examiner*—Stephen W Jackson
*Assistant Examiner*—Zeev Kitov
(74) *Attorney, Agent, or Firm*—Chen Yoshimura LLP

(57) ABSTRACT

A power plug includes a base, an upper cover attached to the base, a base-side cover adjacent the base and removeably attached to the upper cover, an output cord, a leakage current detection and protection circuit for detecting a leakage current in the output cord, and an electrical connection mechanism for electrically connecting and disconnecting an input side and an output of the power plug. The leakage current detection and protection circuit and the electrical connection mechanism are attached to the base and disposed substantially within a space enclosed by the base and the upper cover. A plurality of connecting ends of the circuit extend from the space enclosed by the base and the upper cover into a space enclosed by the base-side cover and the upper cover. Wires of the output cord are connected to the connecting ends, respectively.

2 Claims, 7 Drawing Sheets

POWER PLUG WITH LEAKAGE CURRENT DETECTION AND PROTECTION CIRCUIT

This application claims foreign priority benefits under 35 U.S.C. §119(a)-(d) from China Patent Application No. 200620134149.X, filed Oct. 23, 2006, which is incorporated by reference in its entirety.

BACKGROUND OF THE INVENTION

1. Field of the Invention

This invention relates to a power plug with a leakage current protection circuit (LCDI), and in particular, it relates to a power plug with a leakage current protection circuit used in appliances such as air conditioner, refrigerator, etc.

2. Description of the Related Art

With the wide use of household electrical appliances, more attention is being paid to the safety of using such appliances. A power plug with leakage current protection function is described in commonly owned U.S. Pat. Pub. No. 2006/0061924, published Mar. 23, 2006.

SUMMARY OF THE INVENTION

The present invention is directed to a power plug with leakage current detection and protection functions that substantially obviates one or more of the problems due to limitations and disadvantages of the related art.

An object of the present invention is to provide a power plug that can quickly detect leakage current in the power cord and cut off power output from the power plug.

Another object of the present invention is to provide such a power plug that is easy to manufacture.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides a power plug which includes: a base; an upper cover attached to the base; a base-side cover disposed adjacent the base and removably attached to the upper cover; an output cord including a plurality of wires; a leakage current detection and protection circuit for detecting a leakage current in the output cord; and an electrical connection mechanism for electrically disconnecting an input side and an output of the power plug in response to a detection of a leakage current detection in the output cord, wherein the leakage current detection and protection circuit and the electrical connection mechanism are mounted on the base and disposed substantially within a space enclosed by the base and the upper cover, wherein a plurality of connecting ends of the leakage current detection and protection circuit extend from the space enclosed by the base and the upper cover into a space enclosed by the base-side cover and the upper cover, and wherein the plurality of wires of the output cord are connected to the plurality of connecting ends, respectively.

In another aspect, the present invention provides a method for assembling a power plug, the power plug including a base, an upper cover, a base-side cover, an output cord including a plurality of wires, a leakage current detection and protection circuit for detecting a leakage current in the output cord, and an electrical connection mechanism for electrically disconnecting an input side and an output of the power plug in response to a detection of a leakage current detection in the output cord, the method including: mounting the leakage current detection and protection circuit and the electrical connection mechanism on the base; attaching the upper cover to the base to substantially enclose the leakage current detection and protection circuit and the electrical connection mechanism within a space defined by the base and the upper cover with a plurality of connecting ends of the leakage current detection and protection circuit extend from the space enclosed by the base and the upper cover; and attaching the base-side cover to the upper cover to enclose the plurality of connecting ends. The method further includes connecting the plurality of wires of the output cord to the plurality of connecting ends, respectively.

It is to be understood that both the foregoing general description and the following detailed description are exemplary and explanatory and are intended to provide further explanation of the invention as claimed.

DETAILED DESCRIPTION OF THE PREFERRED EMBODIMENTS

Figure 1:
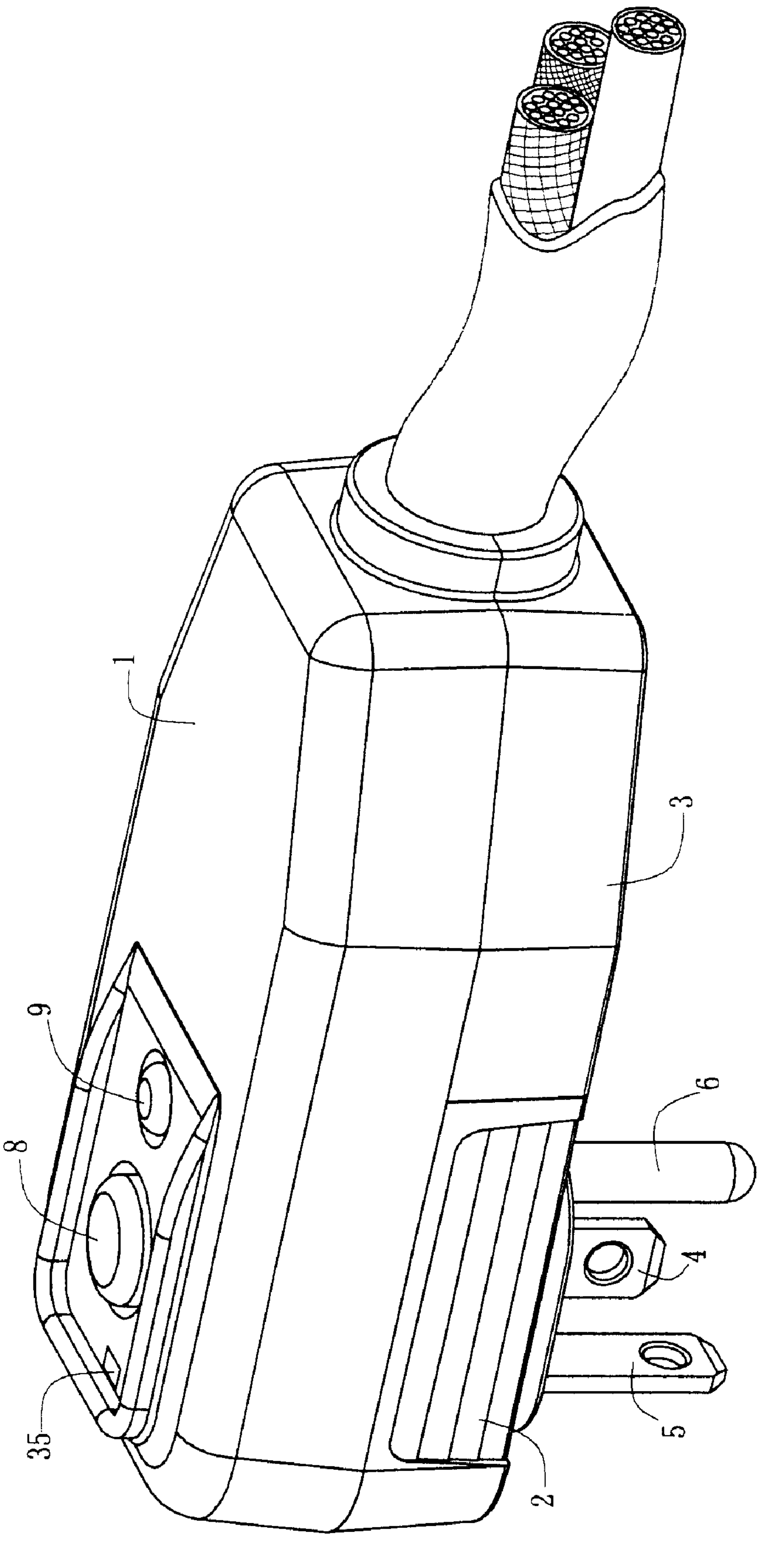
FIG. 1 is an exterior perspective view of a power plug according to an embodiment of the present invention.
Figure 2:
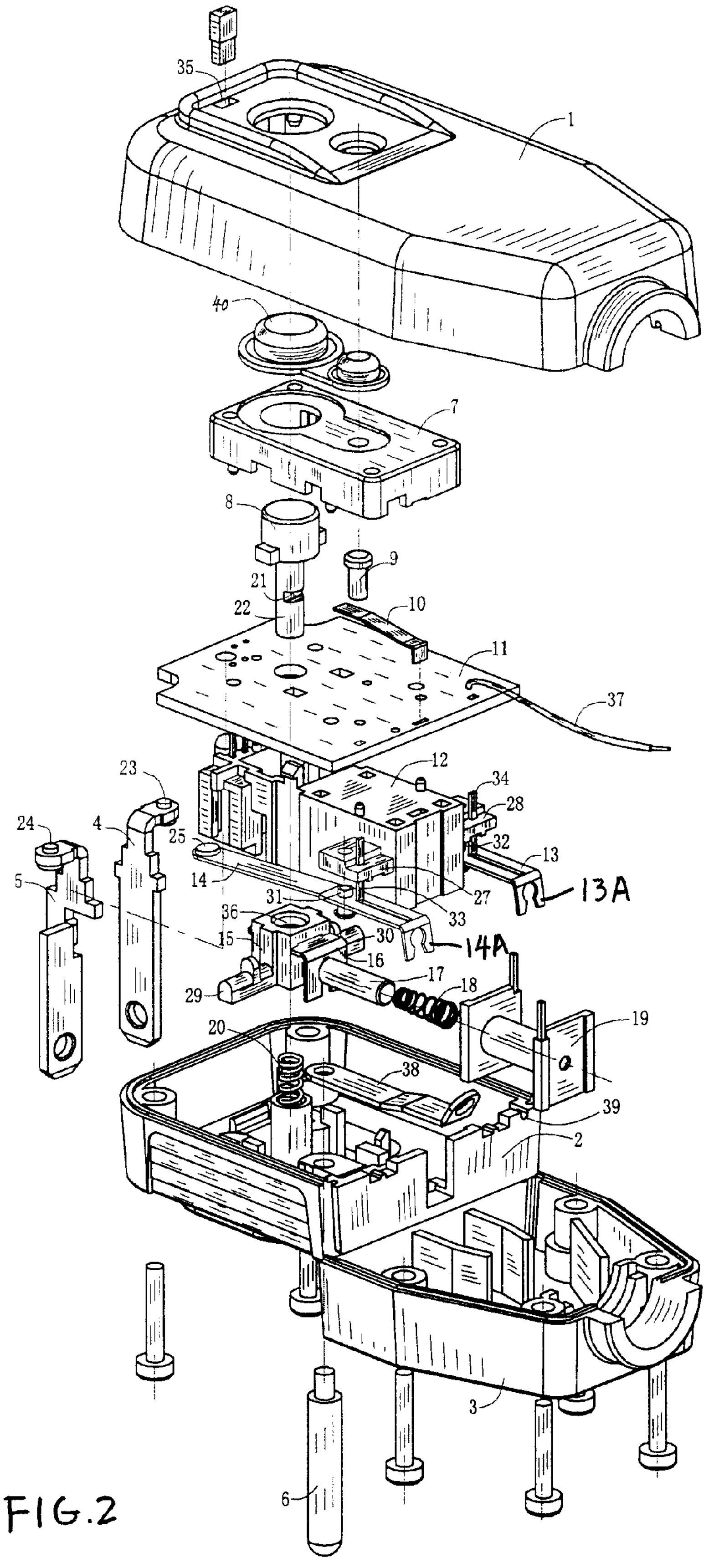
FIG. 2 is an exploded view showing the structure of the power plug.
Figure 3:
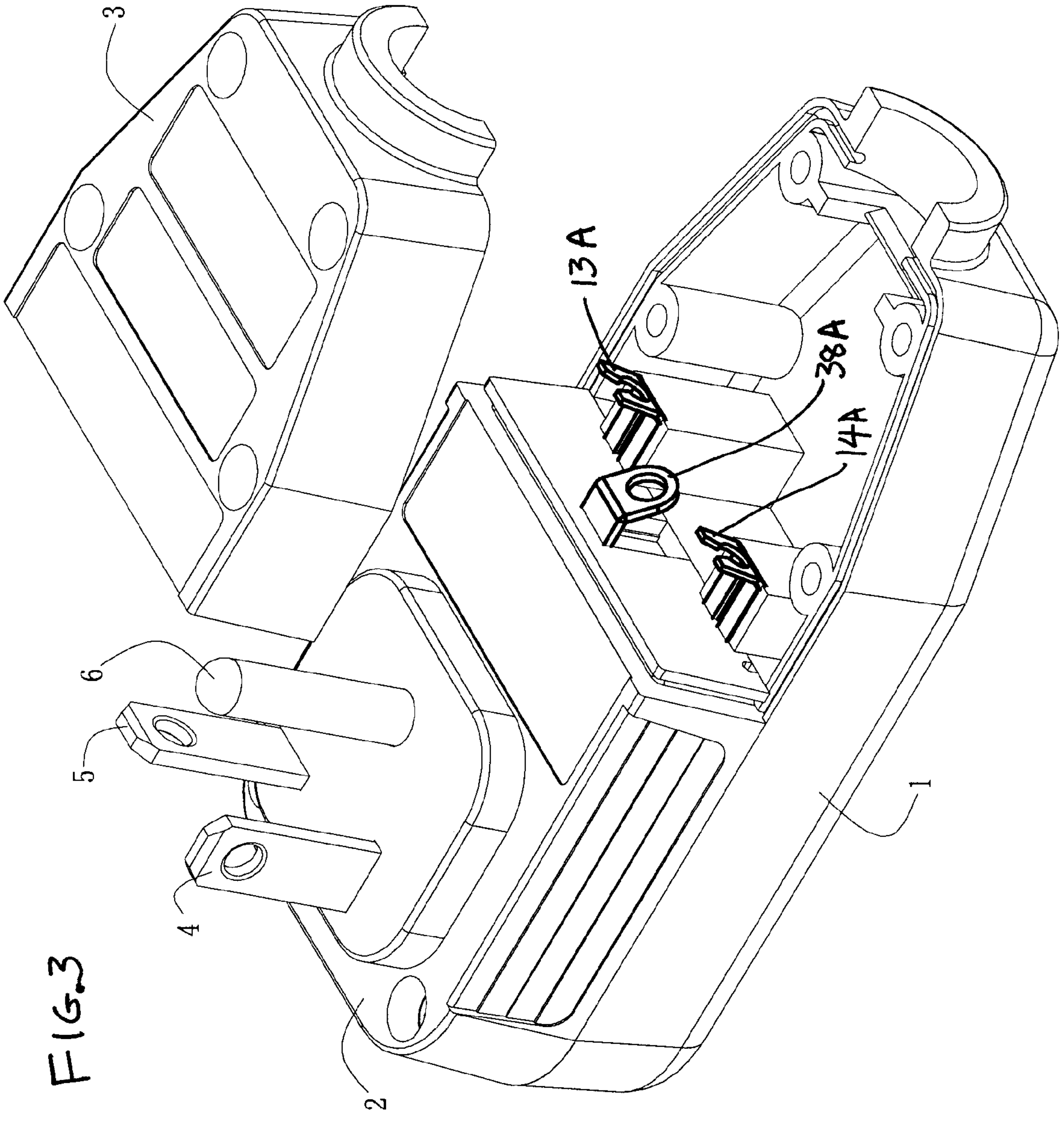
FIG. 3 is a perspective view showing the power plug with cover 3 removed.

As shown in FIGS. 1, 2 and 3, the power plug with leakage current protection function according to an embodiment of the present invention includes a body, phase, neutral and ground prongs on the body, an electrical connection mechanism disposed within the body, and a leakage current detection and protection circuit for detecting a leakage current in the output cord of the power plug.

As shown in FIG. 1, the body is formed of an upper cover 1, base 2 and a base-side cover 3. Located on the upper cover is a reset button (RESET) 8, a test button (TEST) 9, and an indicator light opening 35. The reset button 8 is coupled to a reset switch which is connected in series in the power supply path. Located on the base 2 are three insertion prongs, namely, the phase prong 4, neutral prong 5 and ground prong 6. The first ends of the phase prong 4 and neutral prong 5 are exposed and the second ends of the prongs pass through the base 2 to be mounted on the body. As shown in FIG. 2, stationary contact terminals 23 and 24 are provided on the second ends of the prongs 4 and 5, respectively. The first end of the ground prong 6 is exposed and the second end of it passes through the based 2 to be connected to the base via a grounding plate 38.

Figure 4:
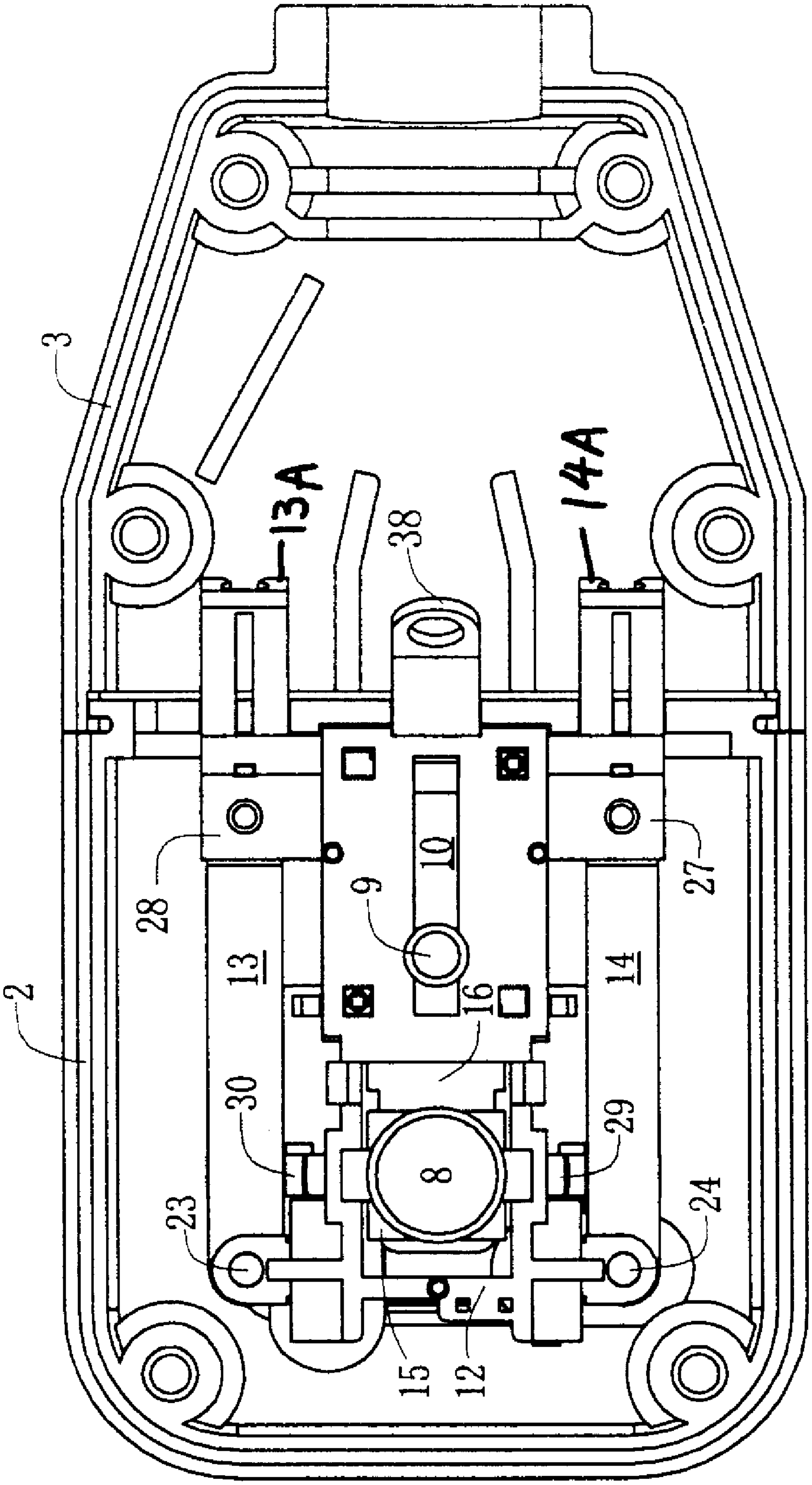
FIG. 4 is a top view of the power plug with upper cover removed, showing various components of the power plug and their spatial relationship.

As shown in FIGS. 2 and 4, the electrical connection mechanism disposed within the body includes a disconnect mechanism 15, L-shaped lock member 16, a solenoid 19 having a disconnect plunger 17, a pair of moveable contact levers 13, 14, and a reset shaft 22.

The disconnect mechanism 15 is disposed between the phase and neutral prongs 4 and 5 and the solenoid 19, below the reset button 8 and a circuit board 11, and within a moveable contact frame 12. The disconnect mechanism has a vertical through hole 36 and two side arms 29, 30 extending sideways. Note that directional terms such as "vertical," etc. are used relative to the orientation of FIGS. 1 and 2 and do not refer to the orientation of the plug when in use. The moveable contact frame 12 is mounted on the circuit board 11.

Figure 5A:
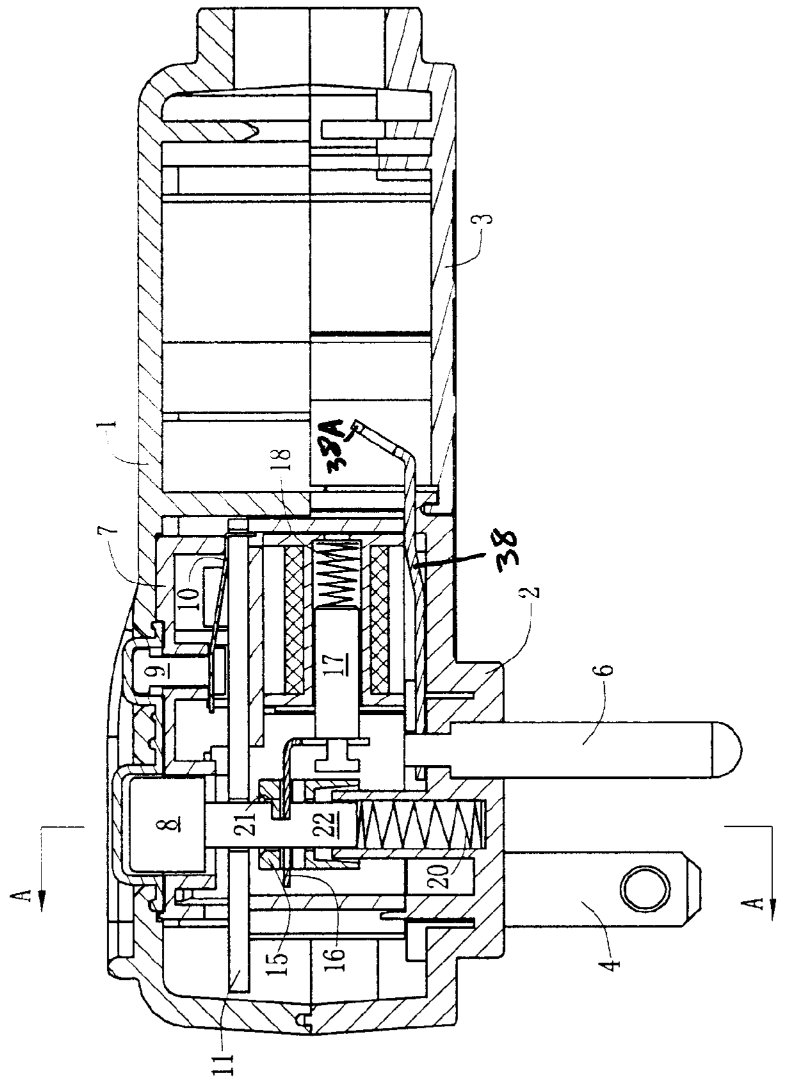
FIG. 5A is a cross-sectional view illustrating the power plug in a normal working state, showing the electrical connection between the input side and output side of the power plug.
Figure 5B:
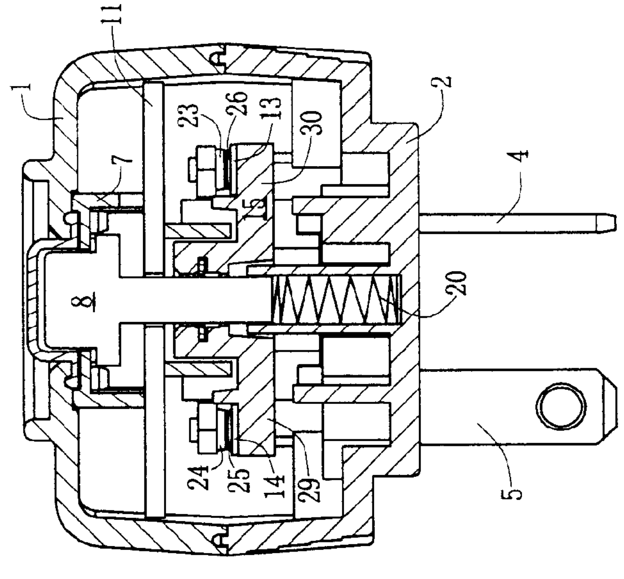
FIG. 5B is a cross-sectional view of the power plug of FIG. 5A along the line A-A.

As shown in FIGS. 5A, 5B, the L-shaped lock member 16 is laterally slidably inserted into the disconnect mechanism 15. A through hole is provided on the top portion of the L-shaped lock member 16. The side portion of the L-shaped lock member has a slot for coupling to the disconnect plunger 17 which is disposed in the solenoid 19, so that the L-shaped lock member 16 is driven by the plunger 17 to moves laterally.

One end of the disconnect plunger 17 has a groove to couple it to the side portion of the L shaped lock member 16, and the other end of the plunger is located inside the solenoid 19 with a disconnect spring 18 disposed at that end. The two terminals of the solenoid 19 are electrically connected to the circuit board 11 via the moveable contact frame 12, and are electrically connected to the phase and neutral wires on the circuit board through the leakage current detection and protection circuit.

The reset shaft 22 is located under the reset button 8, and has a groove 21 for receiving the lock member 16. Under the force of the reset button, the reset shaft 22 is moveable vertically inside the vertical through hole 36 of the disconnect mechanism 15. A reset spring 20 is disposed between the lower end of the reset shaft 22 and the base 2.

As shown in FIGS. 2 and 4, the moveable contact levers 14, 13 are located above the side arms 29, 30 of the disconnect mechanism 15, respectively. One ends of the moveable contact levers 14, 13 are provided with moveable contact terminals 25, 26 which correspond in position to the stationary contact terminal terminals 24, 23 on the neutral and phase prongs 5, 4, respectively, to form two pairs of connect/disconnect contacts (the reset switch). The other ends of the moveable contact levers 14, 13 are mounted by a pair of rivets 31, 32 on two side connection pieces 27, 28 of the moveable contact frame 12. Two connecting pieces 33, 34 extend from the side connection pieces 27, 28 of the moveable contact frame 12 to be soldered onto the circuit board 11 as the power input of the circuit.

Figure 7:
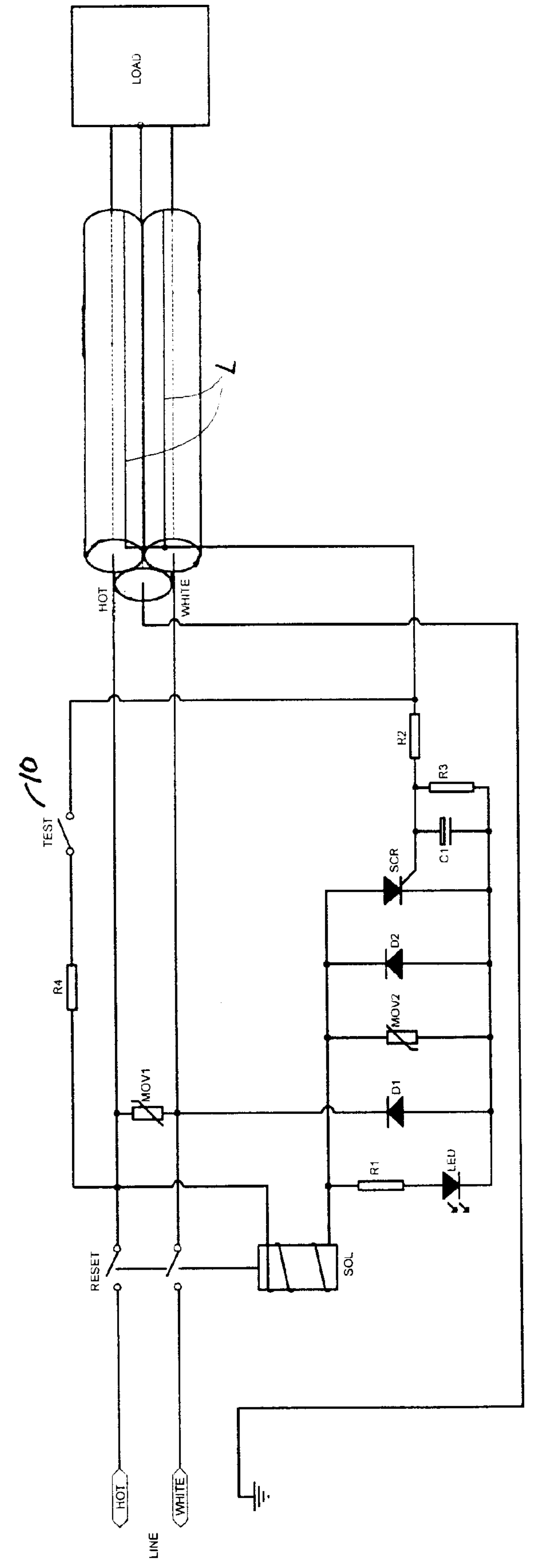
FIG. 7 is a circuit diagram showing the leakage current detection and protection circuit of the power plug.

As shown in FIG. 2, a test switch 10 is disposed under the test button 9. As shown in FIG. 7, the test switch 10 is connected at one end via resistor R4 to the output side phase line HOT of the power plug, and connected at the other end to s metal sheath L of the phase and neutral lines of the output cord of the power plug. When the test button is pressed down, the test switch 10 is closed, the output phase line HOT is connected via resistors R4 and R2, the control gate and cathode of a silicon-controlled rectifier SCR, and diode D1 to the output neutral line WHITE to generate a test current. This triggers the SCR into a conducting state, energizing the solenoid 19 to generate a magnetic field. The plunger 17 moves as a result, pushing the L-shaped lock member 16 to move laterally, causing the reset shaft 22 to escape from the through hole on the top portion of the L-shaped lock member. This in turn causes the disconnect mechanism 15 to drop, disconnecting the stationary contact terminal terminals 23, 24 from moveable contact terminals 25, 26 on the moveable contact levers 13, 14, cutting off the power supply to the output side.

A shielding line 37 is soldered on the circuit board 11, and is led from a small hole 39 on the base 2 out to the metal sheath of the cord.

Above the circuit board 11 is a support frame 7 with four positioning holes and four positioning posts. The four positioning holes of the support frame 7 receives four positioning posts of the upper cover, and the four positioning posts of the support frame 7 are inserted into four positioning holes on the circuit board 11. Thus, the support frame 7 is securely positioned between the circuit board 11 and the upper cover 1 and functions to support and position the waterproof cap 40 of the reset button 8 and the test button 9 as well as the test switch 10. The waterproof cap 40 covers the reset button 8 and the test button 9, and is pressed in place by the support frame 7 and the upper cover 1 to prevent water from entering the body of the power plug.

FIG. 7 is a circuit diagram of the leakage current detection and protection circuit on the circuit board 11. As shown in this figure, the leakage current detection and protection circuit includes the silicon-controlled rectifier SCR, diodes D1 and D2, capacitor C1, resistors R2 and R3 and solenoid SOL 19 with the plunger 17. The control gate of the SCR is connected via resistor R2 to the metal sheath L of the output cord of the power plug. The solenoid SOL, the SCR and diode D1 are connected in series, and then connected between the phase line HOT and neutral line WHITE on the output side to form an SCR conducting circuit. Connected in parallel with the control gate and cathode of the SCR is another diode D2.

Figure 6A:
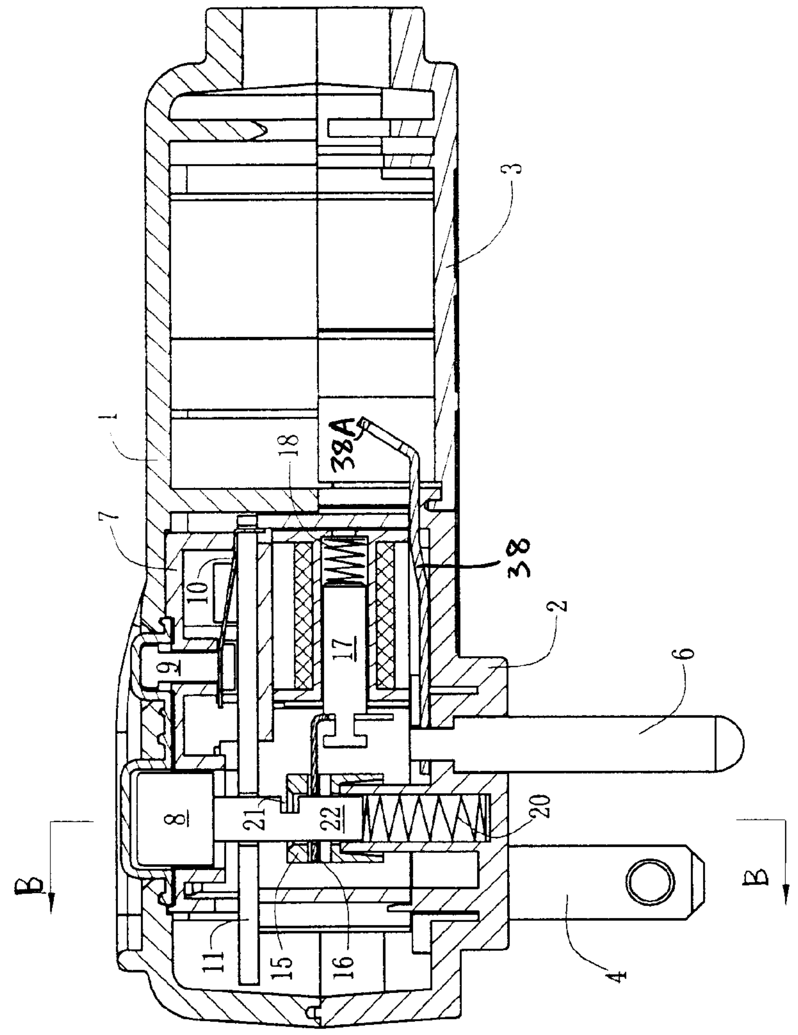
FIG. 6A is a cross-sectional view illustrating the power plug in a disconnected state after detecting a leakage current on the output side of the plug, showing the electrical disconnection between the input side and output side of the power plug.
Figure 6B:
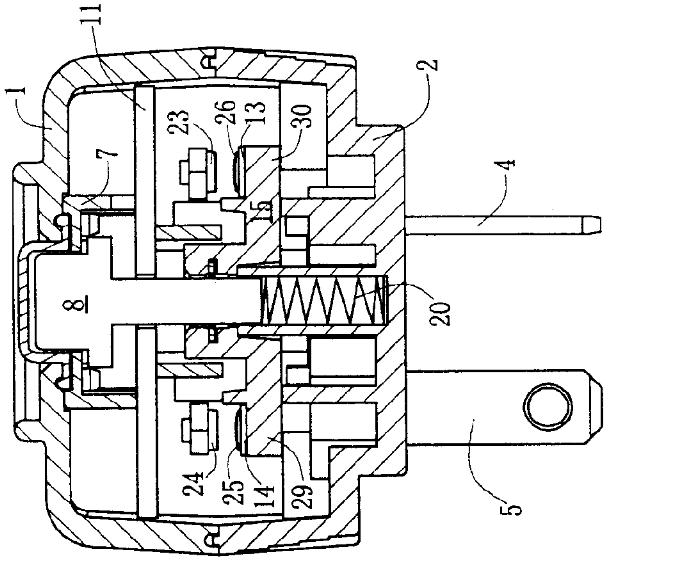
FIG. 6B is a cross-sectional view of the power plug of FIG. 6A along the line B-B.

When the phase HOT, neutral WHITE and ground lines on the output side of the power plug do not have any leakage current, the SCR does not conduct, the solenoid SOL 19 is not energized, and the power plug works normally. When leakage current is present between the phase HOT, neutral WHITE and ground lines on the output side due to exposed lines caused by aged or damaged cord, the sheath L is live, and the sheath L, resistor R2, R3, capacitor C1, and diode D1 or D2 form a conducting circuit. This conducting circuit results in a positive voltage drop across the resistor R3, triggering the SCR into a conductive state. As a result, the solenoid SOL is energized, activating the plunger 17 to push the L-shaped lock member 16 to move laterally (see FIGS. 4, 5A and 5B). The reset button RESET is released, cutting off the electrical connection between the line side LINE and the load side LOAD of the power plug. Power to the load is therefore cut off. This state is shown in FIGS. 6A and 6B.

The operating principle of the power plug is illustrated in FIGS. 5 and 7. When the reset button RESET 8 is pressed down, the groove 21 of the reset shaft 22 slides into the through hole of the L-shaped lock member 16. Under the force of the disconnect spring 18, one side of the edge of the through hole on the lock member 16 goes into the groove 21 of the reset shaft 22. When the reset button RESET 8 is then released, under the force of the reset spring 20, the reset shaft 22 moves upward, and via the lock member 16, brings the disconnect mechanism 15 to move upward. The moveable contact levers 14, 13 located above the side arms 29, 30 of the disconnect mechanism 15 move upward, causing the moveable contact terminals 25, 26 to contact the stationary contact terminal terminals 24, 23 on the neutral and phase prongs 5, 4.

As a result, the input side and output side of the power plug are electrically connected, supplying power to the appliance LOAD.

As shown in FIGS. 6 and 7, when a current leakage exist in the phase or neutral wires of the power cord to the load, a conducting circuit for the leakage current is formed from the sheath L via the electrical components on the circuit board to the phase or neutral line. The current signal triggers the SCR into a conductive state, the solenoid 19 is energized and forms a magnetic field to drive the plunger 17. The plunger 17 moves the lock member 16 inserted into the disconnect mechanism 15, causing the groove 21 on the reset shaft 22 to escape from the through hole of the lock member 16. The force of the reset spring 20 is no longer applied on the disconnect mechanism 15, so the disconnect mechanism 15 drops under the spring tension of the deformed moveable contact levers 13, 14, causing the causing the moveable contact terminals 25, 26 on the moveable contact levers 14, 13 to be disconnected from the stationary contact terminal terminals 24, 23 on the neutral and phase prongs 5, 4. As a result, the input side and output side of the power plug are disconnected, cutting off power to the appliance LOAD.

When a user wishes to cut off the power output, he presses down the test button TEST 9 to close the test switch 10. As shown in FIG. 7, a conductive circuit is formed from the phase line HOT on the output side of the power plug via electrical components on the circuit board to the neutral line WHITE on the output side. The current signal triggers the SCR into a conductive state, the solenoid 19 is energized and forms a magnetic field to drive the plunger 17. The plunger 17 moves the lock member 16 inserted into the disconnect mechanism 15, causing the groove 21 on the reset shaft 22 to escape from the through hole of the lock member 16. The force of the reset spring 20 is no longer applied on the disconnect mechanism 15, so the disconnect mechanism 15 drops under the spring tension of the deformed moveable contact levers 13, 14, causing the causing the moveable contact terminals 25, 26 on the moveable contact levers 14, 13 to be disconnected from the stationary contact terminal terminals 24, 23 on the neutral and phase prongs 5, 4. As a result, the input side and output side of the power plug are disconnected, cutting off power to the appliance LOAD.

To indicate to the user the operating state of the power plug, an indicator circuit is provided, as shown in FIGS. 1, 2 and 7. The indicator circuit includes resistor R1, light emitting diode LED and diode D3 connected in series between the phase line HOT and neutral line WHITE on the output side. A hole 35 is provided on the body at the location of the LED. When the reset button RESET 8 is closed, power is outputted on the output side, the LED light up to indicate that the power plug is working properly. When the reset switch is open and no power is supplied to output side, the LED does not light up, indicating that no power is output.

In use, before operating the appliance, the user plugs the power plug into a power receptacle with the RESET button the reset state. The user then presses the test button 9, which should cause the reset button 8 to jump up with the power plug in a disconnected state. This indicates that the leakage current detection and protection circuit is functioning properly. The user the presses the reset button to reset the power plug, and power will now be supplied to the load.

The removable base-side cover 3 is provided for easy access to the connecting points where the wires of the cord are connected to the leakage current detection and protection circuit. As shown in FIGS. 1-5A, the base-side cover 3 is made of a separate piece from the base 2 and is disposed adjacent the base 2. The circuit board 11 is attached to the base 2 but not to the base-side cover 3. Three connecting ends 13A, 14A and 38A, which are parts of moveable contact lever 13, moveable contact lever 14 and grounding plate 38, respectively, extend from a space enclosed by the base 2 and the upper cover 1 into a space enclosed by the base-side cover 3 and the upper cover 1. The shielding line 37 soldered on the circuit board 11 is led from a small hole 39 on the base 2 out to the space enclosed by the base-side cover 3 and the upper cover 1. The base-side cover 3 is mounted on the upper cover 1 by screws, and can be removed from the upper cover 1 without affecting the circuit board 11. With the base-side cover 3 removed, the connecting ends 13A, 14A and 38A are easily accessible, and wiring terminals of the cord (not shown in FIG. 3) can be connected to these connecting ends by screws or soldering after the rest of the power plug (the head) has been assembled. Similarly, the shielding line 37 can be connected to the metal sheath of the cord. An advantage of this easy accessibility is that it allows the head of the power plug to be manufactured without attaching the cord, and power cords of different desired lengths can be connected to the plug heads afterwards. Because customers sometimes order power plus with different cord lengths, this accessibility allows the same plug (without the cord) to be manufactured in volume, and different length cords can be attached once a customer order is received, reducing the time required to fulfill the customer order. In addition, when damage occurs during use of the power plug, it is possible to replace either the cord or the head of the power plug by simply removing the base-side cover 3 and disconnect the wires of the cord from the connecting ends 13A, 14A and 38A.

While the disconnect mechanism and the leakage current detection and protection circuit are described in detail in this disclosure, one aspect of the invention is the provision of the base-side cover 3 which allows the connecting ends 13A, 14A and 38A to be easily accessed without affecting the disconnect mechanism and the circuit board. This aspect of the invention may be practiced regardless of the specific structures of the disconnect mechanism and the leakage current detection and protection circuit disposed within the base 2 and the upper cover 1. Any suitable structures may be used, including those used in existing power plugs or those to be developed in the future.

It will be apparent to those skilled in the art that various modification and variations can be made in the power plug of the present invention without departing from the spirit or scope of the invention. Thus, it is intended that the present invention cover modifications and variations that come within the scope of the appended claims and their equivalents.

What is claimed is:

1. A power plug comprising:

a base;

an upper cover attached to the base;

a base-side cover disposed adjacent the base and removeably attached to the upper cover;

an output cord including a plurality of wires;

a leakage current detection and protection circuit for detecting a leakage current in the output cord; and an electrical connection mechanism for electrically disconnecting an input side and an output side of the power plug in response to a detection of a leakage current detection in the output cord, wherein the leakage current detection and protection circuit and the electrical connection mechanism are mounted on the base and disposed substantially within a space enclosed by the base and the upper cover, wherein a plurality of connecting ends of the leakage current detection and protection circuit extend from the space enclosed by the base and the upper cover into a space enclosed by the base-side cover and the upper cover, and wherein the plurality of wires of the output cord are connected to the plurality of connecting ends, respectively;

wherein the leakage current detection and protection circuit includes a circuit board attached to the base, a support frame disposed between the circuit board and the upper cover, the support frame including a plurality of positioning holes and a plurality of positioning posts, wherein the upper cover includes a plurality of positioning posts inserted into the corresponding positioning holes of the support frame, wherein the circuit board includes a plurality of positioning holes receiving the corresponding positioning posts of the support frame, wherein the power plug further includes a reset button and a test button mechanically coupled to the electrical connection mechanism, the reset button and test button being supported by the support frame and partially protrude though the upper cover, and wherein the power plug further includes a waterproof cap disposed between the support frame and the upper cover and covering the reset button and the test button.

2. A power plug comprising:

a base;

an upper cover attached to the base;

an output cord;

a leakage current detection and protection circuit for detecting a leakage current in the output cord;

an electrical connection mechanism for electrically disconnecting an input side and an output side of the power plug in response to a detection of a leakage current detection in the output cord;

wherein the leakage current detection and protection circuit and the electrical connection mechanism are disposed within a space enclosed by the base and the upper cover, and wherein the leakage current detection and protection circuit includes a circuit board attached to the base, a support frame disposed between the circuit board and the upper cover;

a reset button and a test button mechanically coupled to the electrical connection mechanism, the reset button and test button being supported by the support frame and partially protrude though the upper cover; and a waterproof cap disposed between the support frame and the upper cover and covering the reset button and the test button, wherein the support frame includes a plurality of positioning holes and a plurality of positioning posts, wherein the upper cover includes a plurality of positioning posts inserted into the corresponding positioning holes of the support frame, and wherein the circuit board includes a plurality of positioning holes receiving the corresponding positioning posts of the support frame.

* * * * *